US 8,553,814 B2

(12) United States Patent
Molina et al.

(10) Patent No.: US 8,553,814 B2
(45) Date of Patent: Oct. 8, 2013

(54) RAPID SAMPLING PHASE RECOVERY

(75) Inventors: Albert Molina, Madrid (ES); Oisin Ó Cuanacháin, Baile Atha Cliath (IE); Ramon Sanchez, Madrid (ES)

(73) Assignee: LSI Corporation, San Jose, CA (US)

( * ) Notice: Subject to any disclaimer, the term of this patent is extended or adjusted under 35 U.S.C. 154(b) by 899 days.

(21) Appl. No.: 12/533,568

(22) Filed: Jul. 31, 2009

(65) Prior Publication Data
US 2011/0026650 A1 Feb. 3, 2011

(51) Int. Cl.
*H04L 27/06* (2006.01)
(52) U.S. Cl.
USPC .......................... 375/344; 375/355; 375/376
(58) Field of Classification Search
USPC .............. 375/219, 229, 334, 341, 346, 348, 375/355, 371, 376; 455/334
See application file for complete search history.

(56) References Cited

U.S. PATENT DOCUMENTS

| | | | | |
|---|---|---|---|---|
| 5,337,285 A * | 8/1994 | Ware et al. | | 365/227 |
| 5,812,615 A * | 9/1998 | Baum et al. | | 375/344 |
| 6,005,640 A * | 12/1999 | Strolle et al. | | 348/726 |
| 6,385,319 B1 * | 5/2002 | Nyu | | 380/274 |
| 2002/0186804 A1 | 12/2002 | Dorschky et al. | | |
| 2003/0026369 A1 | 2/2003 | Murray et al. | | |
| 2004/0001538 A1 * | 1/2004 | Garrett | | 375/229 |
| 2004/0048595 A1 | 3/2004 | Miller et al. | | |
| 2006/0104342 A1 * | 5/2006 | Shanbhag et al. | | 375/234 |
| 2007/0090886 A1 * | 4/2007 | Kriz | | 331/17 |
| 2009/0225779 A1 * | 9/2009 | Diab et al. | | 370/469 |

FOREIGN PATENT DOCUMENTS

| | | |
|---|---|---|
| WO | 96/41439 A1 | 12/1996 |
| WO | 98/32243 A1 | 7/1998 |
| WO | WO-9832243 A1 * | 7/1998 |
| WO | 2008/107828 A1 | 9/2008 |
| WO | WO-2008107828 A1 * | 9/2008 |

OTHER PUBLICATIONS

European Search Report for EP 10170642.2 dated Nov. 11, 2010.
M. Grimwood et al., "LPI Synchronization Feasibility Questions," Broadcom IEEE802.3az Task Force, Mar. 2008, 12 pages, Orlando, Florida.
L.D. Paulson, "News Briefs: IEEE Works on Energy-Efficient Ethernet,", Computer Magazine, IEEE Computer Society, May 2007, p. 21.

* cited by examiner

*Primary Examiner* — Leon-Viet Nguyen
(74) *Attorney, Agent, or Firm* — Ryan, Mason & Lewis, LLP

(57) ABSTRACT

In a communication receiver, timing recovery circuitry includes a loop filter associated with a timing recovery loop of a first communication device. The first communication device is in communication with a second communication device prior to a temporary power down/power up sequence in the first communication device. The loop filter is configured to: (i) temporarily disable at least a portion of the timing recovery loop after the temporary power down/power up sequence in the first communication device; and (ii) initiate a progression through a set of potential sampling phases to determine a given sampling phase at which the first communication device can recommence communication with the second communication device.

20 Claims, 3 Drawing Sheets

RAPID SAMPLING PHASE RECOVERY

FIELD OF THE INVENTION

The present invention is related to data communication networks and, more particularly, to techniques for recovering a sampling phase so as to continue communication between transceivers in a communication network.

BACKGROUND OF THE INVENTION

In a communication network including a plurality of transceivers, it may be necessary or at least desirable for a first transceiver, which has a synchronous communication link with a second transceiver, to be powered down and then powered back up again before there has been any significant frequency drift between the two transceivers. Before data transmission can recommence, the optimal sampling phase must be recovered at the first transceiver. As is known, the purpose of recovering the "sampling phase" is so that the correct time within a data symbol for which to take a sample can be determined (as compared with recovering the "sampling frequency" which involves estimating the symbol period so that samples can be taken at the correct rate). The receiver process of recovering (locking) both the sampling phase and the sampling frequency is cumulatively referred to as "timing recovery."

An example of this power down/power up scenario may arise in the current scheme for Energy-Efficient Ethernet proposed by the Institute of Electrical and Electronics Engineers (IEEE), i.e., IEEE P802.3az Energy-Efficient Ethernet Study Group. The main purpose of the IEEE scheme is to develop a standard to make Ethernet connections more energy (power) efficient. Such a scheme could help to reduce energy consumption in servers, personal computers, and laptops, as well as in switches, routers and other network equipment. In the IEEE scheme, it is proposed that when the medium access controllers (MACs) at both ends of an active Ethernet link have no data to send, then one or both transceivers could be powered down to save power. The transceivers would then have to wake rapidly should any data arrive to be transmitted so that the link would not be lost.

SUMMARY OF THE INVENTION

Principles of the invention provide techniques for recovering a sampling phase. In particular, these techniques allow continuation of communication between transceivers in a communication network after a power down/power up sequence. While the inventive techniques are particularly suitable to the above-mentioned IEEE Energy-Efficient Ethernet scheme, they are not limited thereto.

In one aspect of the invention, an apparatus comprises timing recovery circuitry comprising a loop filter associated with a timing recovery loop of a first communication device. The first communication device is in communication with a second communication device prior to a temporary power down/power up sequence in the first communication device. The loop filter is configured to: (i) temporarily disable at least a portion of the timing recovery loop after the temporary power down/power up sequence in the first communication device; and (ii) initiate a progression through a set of potential sampling phases to determine a given sampling phase at which the first communication device can recommence communication with the second communication device.

In another aspect of the invention, a method of recovering an optimal sampling phase in a receiver after a power down/power up sequence comprises the following steps. A sampling phase recovery portion of a timing recovery loop of the receiver is disabled. A frequency offset is introduced in a frequency recovery portion of the timing recovery loop such that the timing recovery loop progresses through a set of potential sampling phases. As progression through the set of potential sampling phases proceeds, a metric is used to determine how close the timing recovery loop is to the optimal sampling phase. When it is determined that the timing recovery loop is suitably close to the optimal sampling phase, the frequency offset is removed and the phase recovery portion of the timing recovery loop is re-enabled.

Advantageously, in an IEEE Energy-Efficient Ethernet scenario, the optimal sampling phase is rapidly recovered without losing the communication link between the receiver and the transmitter.

These and other objects, features, and advantages of the present invention will become apparent from the following detailed description of illustrative embodiments thereof, which is to be read in connection with the accompanying drawings.

DETAILED DESCRIPTION OF THE INVENTION

The invention will be illustrated herein in conjunction with exemplary communication systems, receivers and receiver components. It should be understood, however, that the invention is more generally applicable to other types of communication systems and receivers, and may be implemented using other receiver component arrangements. For example, the techniques disclosed herein can be adapted in a straightforward manner for use in any communication system comprising one or more links in which it is desirable to rapidly recover a sampling phase so as to continue communication between transceivers in a communication network.

It is to be understood that, while the phrase "optimal sampling phase" may be used herein, the phrase is intended to include "substantially optimal sampling phase," "sub-optimal sampling phrase," or more generally a given sampling phase at which a first communication device (in which such sampling phase is being determined) can recommence communication with a second communication device. That is, it may be that the determined sampling phase that permits continued communication between the two devices after a power down/power up sequence is sub-optimal or substantially optimal, however, such sampling phase is nonetheless suitable for recommencing communication.

Figure 1:
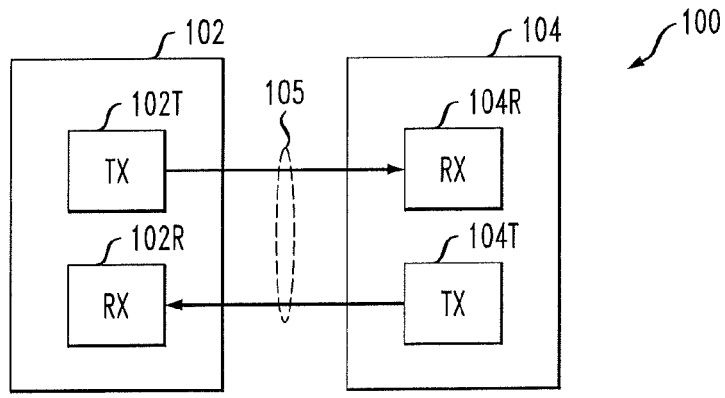
FIG. 1 shows a block diagram of a communication system in accordance with an illustrative embodiment of the invention.

FIG. 1 shows a portion of a communication system 100 in which the present invention is implemented in accordance with one embodiment. The system 100 comprises a first node 102 and a second node 104. The two nodes are connected by a bidirectional data channel transmission medium 105, also referred to herein as a "link." The first node 102 comprises a transmitter 102T configured for communication with a receiver 104R of the second node 104, and further comprises a receiver 102R configured for communication with a transmitter 104T of the second node 104.

The nodes 102 and 104 may be configured to communicate over link 105 in accordance with a known communication standard. One such standard that may be used in illustrative embodiments is the Ethernet family of standards defined under IEEE 802.3, the disclosures of which are incorporated by reference herein. For example, the Ethernet standard could be the 1000BASE-T Ethernet standard, also referred to more generally as "Gigabit Ethernet." By way of another example, the Ethernet standard could be the 10 GBASE-T Ethernet standard.

It is to be appreciated, however, that the present invention can be implemented in communication systems that include other types of links, including, for example, links configured in accordance with standards such as, by way of example only, InfiniBand, IEEE 1394, PCI-Express, Serial Attached SCSI (SAS), Serial Advanced Technology Attachment (SATA), SONET/SDH, or the Fibre Channel specified by American National Standards Institute (ANSI) standards.

A given one of the nodes 102 or 104 may be configured to operate as a backplane in an illustrative embodiment of the invention. Such a backplane may be used, for example, to interconnect multiple switches, application-specific integrated circuits (ASICs), hard disk drives (HDDs) or other system elements. Of course, it is to be understood that principles of the invention are not limited to such operating environments or applications.

The nodes 102, 104 may be viewed as examples of what are more generally referred to herein as communication devices. Such communication devices may comprise, by way of example, a serializer/deserializer (SERDES) device. However, in Gigabit Ethernet application wherein multi-level modulation is used, whereby several bits per symbol are sent (effectively in parallel) and there are typically four such cable pairs, the gigabit receiver may be much more complex than a SERDES. That is, the gigabit receiver may typically include equalization, cross-talk and echo cancellation, as well as forward error correction (FEC) decoding. Nonetheless, it is to be appreciated that principles of the invention are not limited to use with any such particular communication device. Also, the phrase "communication device" is not limited to the examples of communication devices illustratively described herein.

A given node may comprise or be part of another type of communication device, such as a router, switch, computer, server, etc. Conventional aspects of such communication devices are well known and therefore not described in detail herein.

Although only two nodes are shown in FIG. 1, other embodiments of the invention may include many more nodes, in any desired configuration.

Also, a full duplex arrangement of the type illustrated in FIG. 1 is not a requirement of the present invention. In other embodiments, for example, transmitter 104T may communicate with a receiver in a node other than node 102, or transmitter 102T may communicate with a receiver in a node other than node 104.

As will be described in greater detail below, the receivers 102R and 104R in the FIG. 1 embodiment are configured in accordance with principles of the invention to incorporate timing recovery circuitry comprising a rapid-recovery loop filter for use in rapidly recovering a sampling phase so as to continue communication between transceivers (e.g., between a transmitter and the given receiver).

Figure 2:
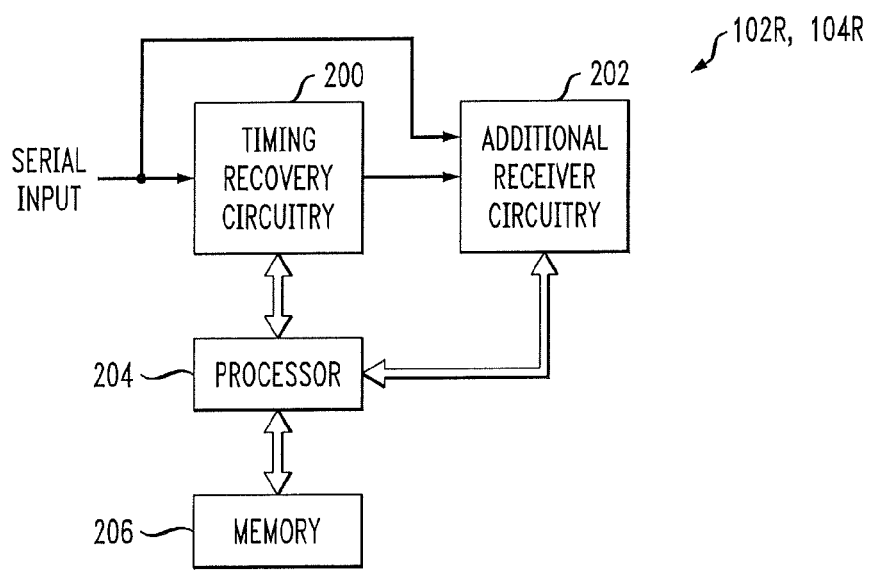
FIG. 2 shows a more detailed view of a receiver of the FIG. 1 system.

FIG. 2 shows a more detailed view of a given one of receivers 102R and 104R in the present embodiment. Each such receiver comprises timing recovery circuitry 200 which receives an input data stream and provides to the additional receiver circuitry 202 of the receiver the correct timing information including, for example, the correct sampling frequency at which to sample the incoming symbols and also the optimal sampling phase to maximize a signal-to-noise ratio (SNR) in the receiver. The additional receiver circuitry 202 may comprise, by way of example but not limited to, signal processing circuitry, equalization circuitry, scrambler circuitry, slicer circuitry, switching circuitry, cross-talk and echo cancellation circuitry, forward error correction circuitry, or other types of conventional circuitry typically found in a communication system receiver. Such conventional circuitry, being well understood by those skilled in the art, will not be described in detail herein.

Also included in the receiver 102R or 104R is a processor 204 coupled to a memory 206. The processor 204 is coupled to the timing recovery circuitry 200, as well as the additional receiver circuitry 202. The memory 206 may be configured to store one or more parameters of the above-mentioned rapid-recovery loop filter, and other timing recovery parameters and control information. Such loop filter and other portions of the timing recovery circuitry 200 (as well as some or all of the portions of the additional receiver circuitry 202) may be operated at least in part under control of the processor. The memory 206 may therefore store program code that is executed by the processor to implement at least a portion of a timing recovery process carried out by the receiver. The memory is an example of what is more generally referred to herein as a computer-readable storage medium or other type of computer program product having computer program code embodied therein, and may comprise, for example, electronic memory such as RAM or ROM, magnetic memory, optical memory, or other types of storage devices in any combination. The processor 204 may comprise a microprocessor, CPU, ASIC, FPGA or other type of processing device, as well as portions or combinations of such devices. In other embodiments, at least a portion of the timing recovery circuitry may be implemented within the processor. Alternatively, the processor may implement at least a portion of the timing recovery circuitry. It should therefore be apparent that a timing recovery technique in accordance with the present invention may be implemented using various combinations of hardware, software and firmware.

The operation of the timing recovery circuitry 200 will now be described in greater detail with reference to FIGS. 3 through 5.

Figure 3:
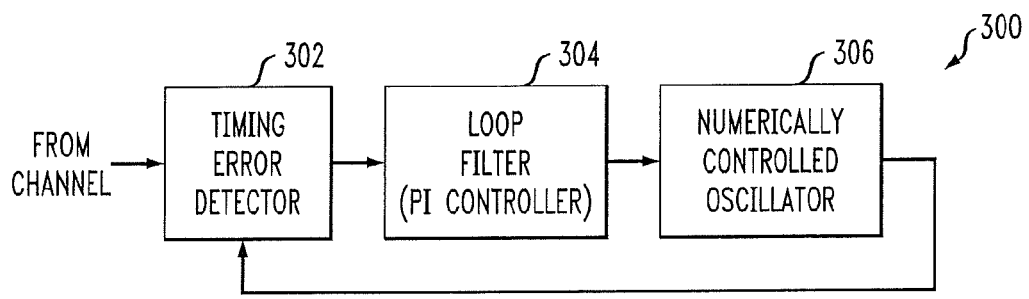
FIG. 3 shows a timing recovery loop in accordance with an illustrative embodiment of the invention.

FIG. 3 illustrates a timing recovery loop 300 that is a part of the overall timing recovery circuitry 200 in the receiver (102R and 104R) shown in FIG. 2. That is, timing recovery circuitry 200 may include other circuitry for performing other known parts of the timing recovery process; these other known parts of the timing recovery process not being the focus of the invention, they are not described in detail herein.

A digital receiver (102R and 104R) receives analog data from a communications channel and performs timing recovery to recover the correct sampling frequency at which to sample the incoming analog symbols and also the optimal sampling phase to maximize SNR in the receiver. The timing recovery loop 300 depicts one illustrative embodiment for performing such timing recovery.

As shown, the timing recovery loop 300 comprises a timing error detector 302, a loop filter 304, and a numerically controlled oscillator 306. These components are connected in a feedback configuration to perform a timing recovery operation. Such a timing recovery operation generally proceeds as follows. Timing error detector 302 takes samples of the received data stream. That is, it is assumed there is a sampler in the timing error detector 302. The timing error detector 302 develops a timing error signal from these samples that is provided to the loop filter 304. In response, the loop filter 304 generates and outputs a signal that adjusts a numerically controlled oscillator 306 so as to provide a sampling control signal that controls the sampler back in the timing error detector 302.

In order to save power, it has been proposed in the Energy-Efficient Ethernet P802.3az standard, the disclosure of which is incorporated by reference herein, that the receiver could be temporarily powered down when there is no data to be sent on the channel link. When new data to be sent does arrive at a corresponding transmitter, the receiver must be quickly powered up and placed in a suitable condition to continue communication with the transmitter. The duration of the temporary power down is such that there should be no significant frequency drift (i.e., no loss of sampling frequency lock) between the local receiver and the remote station (e.g., transmitter). However, the optimal sampling phase will typically be lost. Thus, a main problem to be solved is for the receiver to rapidly recover the optimal sampling phase.

In the above-mentioned Energy-Efficient Ethernet P802.3az scenario, it is realized that the power down could last about 20 milliseconds. Phase could drift by about ±1.4 nanoseconds due to remote transmitter phase drift (mainly due to the accumulated phase jitter in the reference crystal oscillator) and by a similar amount due to the receiver's crystal phase drift, i.e., a total of about ±2.8 nanoseconds out of a symbol period such as 8 nanoseconds. According to the IEEE standard, in 1000BASE-T mode, the receiver must recover timing in 4.616 microseconds. Frequency drift is a much slower process. Over a 20 millisecond period, the frequency could change by a fraction of 1 part per million (ppm). While this is not necessarily specified in 1000BASE-T, in 10 GBASE-T, it is known that the maximum over a 20 millisecond period is 0.0034 ppm.

Assuming that the receiver is powered up again (e.g., after a temporary power down/power up sequence in accordance with the Energy-Efficient Ethernet P802.3az standard) and a data stream is received (from the corresponding transmitter), illustrative principles of the invention address this main problem by temporarily disabling the timing recovery loop in the receiver and testing a set of sampling phases (preferably all potential sampling phases) in rapid succession while a metric is maintained which indicates a proximity to the optimal sampling phase, i.e., how close the process is to achieving the optimal sampling phase. It is to be appreciated that the sampling phase can typically only be adjusted in discrete steps. Typically, the number of discrete phases available is a power of two, e.g., 64, 128 or 256 phases. Accordingly, in one illustrative embodiment, the set of potential sampling phases comprises 128 discrete phases. Thus, given a deliberate frequency offset, principles of the invention provide for initiation of a progression through the set of potential sampling phases until the optimal sampling phase is determined.

In this illustrative embodiment for rapid recovery of the optimal sampling phase of a received signal, it is assumed that sampling frequency lock has already been achieved and is maintained. The illustrative embodiment uses a PI (proportional-integral) controller as a loop filter for timing recovery but disables a sampling phase recovery portion and deliberately introduces a fixed frequency offset in a frequency recovery portion. This has the effect of causing the sampling phase to start to rapidly progress through a set of potential sampling phases, e.g., all possible sampling phases. As this progression proceeds, an attempt is made to lock the scrambler in the receiver and use the quality of lock as a metric of how close the process is to the optimal sampling phase (which will be one of the sampling phases in the set of potential sampling phases). When it is determined that the process has achieved the optimal phase, the deliberate frequency offset is removed and normal timing recovery is re-enabled. In another embodiment, when it is determined that the process is suitably close to the optimal phase, the deliberate frequency offset is removed and the phase recovery portion of the PI controller is re-enabled to track out any residual phase error.

It is realized that without the inventive approach of using a deliberate frequency offset in the timing recovery loop, a conventional timing recovery loop, given a very short allowed time for recovery, may not be able to, among other deficiencies, track out the phase error in the allowed time. Furthermore, changing the loop parameters to try to speed up its response may result in an excessively noisy signal.

Principles of the invention solve this problem by providing an improved loop filter of a timing recovery loop that is able to rapidly recover the optimal sampling phase. Such an inventive loop filter is illustrated in FIG. 4.

Note that circuit components mentioned below may have one or more input terminals, one or more output terminals, and one or more control or enable terminals. Such terminals may be connected as shown in FIG. 4; however, principles of the invention are not limited to this particular component connection arrangement. For clarity of explanation, the specific names of each terminal are not necessarily mentioned below as they are well-known and one skilled in the art would understand their arrangement given the circuit illustration of FIG. 4 and the signal flow descriptions below.

Figure 4:
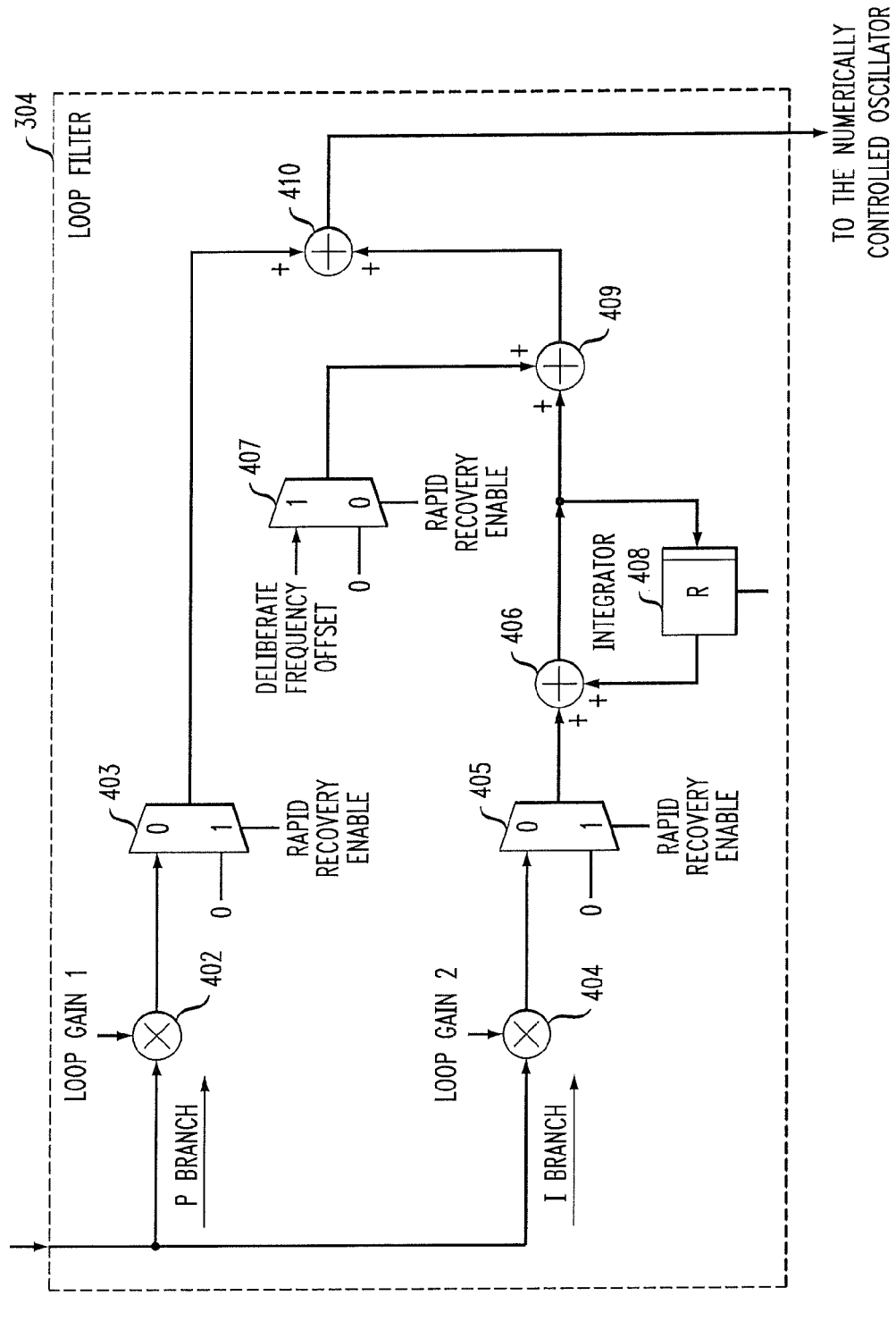
FIG. 4 shows a loop filter in accordance with an illustrative embodiment of the invention.

It is also to be understood that while not specifically shown in FIG. 4, the processor 204 of FIG. 2 may be used to control assertion/de-assertion of the appropriate signals to the control and enable terminals of the certain components that have such terminals. Thus, for example as will be explained in detail below, the processor 204 will cause the rapid recovery enable signals to be asserted such that the loop filter can perform rapid sampling phase recovery.

As shown in FIG. 4, the loop filter 304 comprises a first multiplier 402, a first multiplexer 403, a second multiplier 404, a second multiplexer 405, a first adder 406, a third multiplexer 407, a register 408, a second adder 409, and a third adder 410.

The loop filter 304 selectively operates in a "normal mode" and a "rapid recovery mode." The loop filter 304 comprises a proportional branch (P branch) and an integral branch (I branch), as will now be explained.

The loop filter 304 operates in a normal mode as follows. The proportional branch routes the timing error signal received from the timing error detection 302 through the first multiplier 402. The first multiplier 402 is used to multiply the timing error signal by a first loop gain (Loop Gain 1). The output of the first multiplier 402 passes through the first multiplexer 403 (which is in normal mode when rapid recovery mode is not enabled, i.e., when rapid recovery enable signal is not asserted) and is routed to the third adder 410. The integral branch routes the timing error signal received from the timing error detection 302 through the second multiplier 404. The second multiplier 404 is used to multiply the timing error signal by a second loop gain (Loop Gain 2). The output of the second multiplier 404 passes through the second multiplexer 405 (which is in normal mode when rapid recovery mode is not enabled, i.e., when rapid recovery enable signal is not asserted) and is routed to a first adder 406/register 408 feedback loop. The first adder 406/register 408 feedback loop represents an integrator.

The register 408 is where the current sampling frequency is stored. The first adder 406 adds the output of the second multiplier 404 with the current frequency from the register 408. The output of the integrator passes through the second adder 409, which in normal mode adds nothing to the signal (since the rapid recovery mode is not enabled on the third multiplexer 407, i.e., when rapid recovery enable signal is not asserted), and is routed to the third adder 410. In the third adder 410, the signal provided by the proportional branch is added to the signal provided by the integral branch. The output of the third adder 410 is the signal used to adjust the numerically controlled oscillator (306 in FIG. 3). It is to be appreciated that, in a steady state condition, the phase error coming out of the timing error detector (302 in FIG. 3) should be zero. Therefore, the P branch output should be zero and the loop filter 304 output should be just the output of the integrator register 408. This value is a frequency error which is then translated into a phase ramp by the numerically controlled oscillator 306, as is known.

The loop filter 304 operates in a rapid recovery mode, according to one embodiment of the invention, as follows. It is assumed that when the receiver is disabled (powered down), the correct sampling frequency is saved in the memory of the integrator (i.e., register 408). When the receiver is to be re-enabled rapidly (e.g., upon re-power-up in the Energy-Efficient Ethernet scenario), the signal 'rapid recovery enable' of FIG. 4 will be asserted (this can be asserted in accordance with processor 204 or some other circuitry of the receiver). This has the effect of disabling the normal mode of the timing recovery loop by multiplexing zeros into the proportional and integral branches of the loop filter and at the same time deliberately adding a large frequency offset.

More particularly, when the rapid recovery enable signal is asserted in the loop filter 304, the first and second multiplexers 403 and 405 output logic zeros, and the third multiplexer 407 outputs the frequency offset value that is present on the selected one of its input terminals. This offset value is added with the frequency value stored in the integrator memory (register 408) in the second adder 409 and provided to the third adder 410. In the third adder 410, a zero (from proportional branch) is added to the output of the second adder 409. The output of the third adder is output by the loop filter 304 to the numerically controlled oscillator 306.

The effect of this fixed frequency offset is to cause the numerically controlled oscillator 306 to begin to rapidly progress through all potential sampling phases in succession. In one embodiment, the phase is incremented by one step every two cycles, i.e., by $8/128$ nanoseconds every 16 nanoseconds. This is equivalent to a frequency offset of 0.49 MHz or 3900 ppm. The progression is done in the numerically controlled oscillator 306. It is to be understood that the oscillator is effectively an accumulator. Thus, by putting a fixed value (i.e., deliberate frequency offset) into the accumulator, a ramp is generated that is able to sweep all the potential phase values.

The digital receiver can then try to lock its scrambler (not expressly shown but understood to be part of the additional receiver circuitry 202 in FIG. 2) to the received symbols, as is known. As the optimal sampling phase is approached, the received symbols should be correct and the number of matching symbols in the scrambler should increase. Once a scrambler lock has been achieved (e.g., the number of matching symbols reaches some threshold number), the scrambler notifies the processor 204 which then disables the rapid recovery mode (e.g., de-assert the rapid recovery enable signal) and the normal mode of the timing recovery loop is re-enabled to track out any residual timing errors in the typical manner.

As described above, the illustrative embodiment uses an indication of establishment of the locking of the scrambler in the receiver as a control signal for enabling and disabling the rapid recovery mode but, in a more general case, any performance metric from the receiver could be used, by way of example but not limited to, the mean square error value at the slicer of the receiver or the quality measure of the eye diagram at the slicer. Also, in the above description, the rapid recovery mode uses just a single fixed frequency offset which is enabled or disabled. Alternatively, the added offset could be made variable with its magnitude proportional to a metric of the receiver indicative of how close the process is to the optimal sampling phase.

Figure 5:
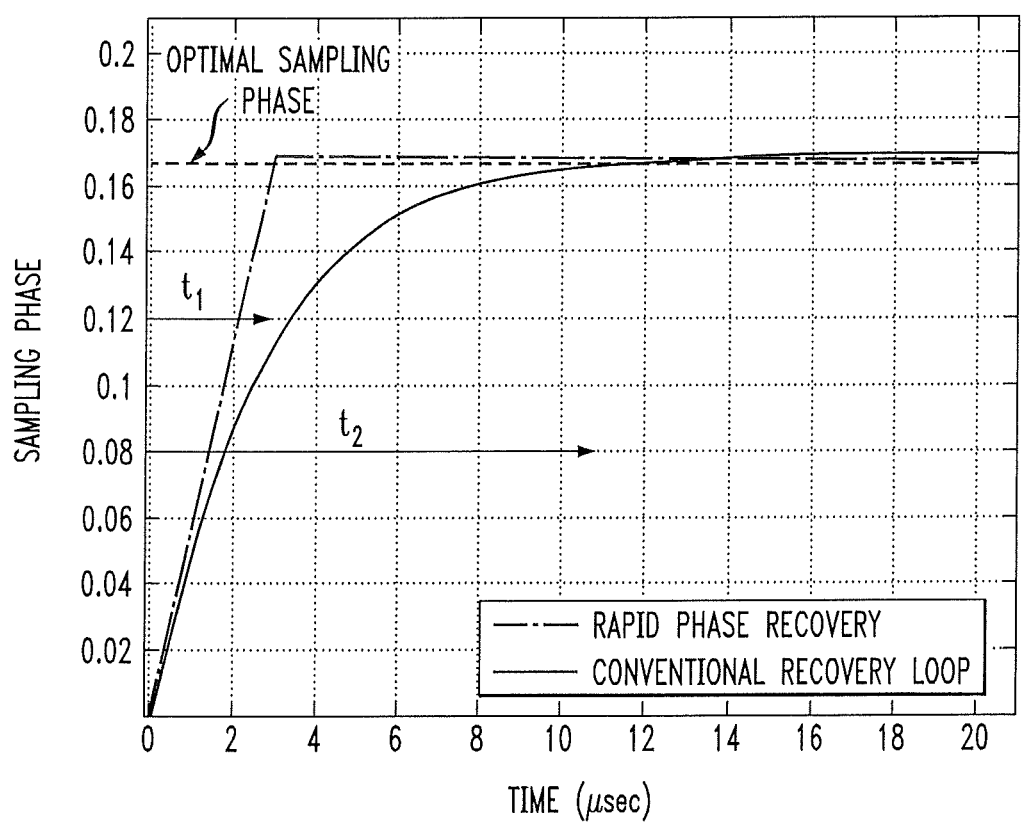
FIG. 5 shows a graphical comparison of sampling phase recovery time in accordance with an illustrative embodiment of the invention.

FIG. 5 illustrates a main benefit of employing illustrative principles of the invention. As shown, the recovery time (i.e., time to achieve the optimal sampling phase) for the rapid recovery approach, t1, is significantly reduced relative to a conventional timing recovery loop recovery time, t2.

It is to be appreciated that, in an integrated circuit implementation of the invention, multiple integrated circuit dies are typically formed in a repeated pattern on a surface of a wafer. Each such die may include a device comprising timing recovery circuitry as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of circuitry, control logic elements, processing elements and other circuit elements for implementing the described functionality. These and numerous other alternative embodiments within the scope of the following claims will be apparent to those skilled in the art.

What is claimed is:

1. An apparatus comprising:
   timing recovery circuitry comprising a loop filter associated with a timing recovery loop of a first communication device, the first communication device being in communication with a second communication device prior to a temporary power down/power up sequence in the first communication device;
   wherein the loop filter is configured to: (i) temporarily disable at least a portion of the timing recovery loop after the temporary power down/power up sequence in the first communication device; and (ii) while the portion of the timing recovery loop is temporarily disabled, introduce a signal in a frequency recovery portion of the timing recovery loop operative to initiate a progression through a set of potential sampling phases to determine a given sampling phase at which the first communication device can recommence communication with the second communication device.

2. The apparatus of claim 1, wherein the loop filter is further configured to re-enable the disabled portion of the timing recovery loop upon determination of the given sampling phase.

3. The apparatus of claim 1, wherein the given sampling phase is determined in accordance with a metric indicative of a proximity to determining the given sampling phase.

4. The apparatus of claim 3, wherein the metric comprises a performance metric.

5. The apparatus of claim 4, wherein the performance metric comprises an establishment of a lock condition in a scrambler of the first communication device.

6. The apparatus of claim 4, wherein the performance metric comprises a given mean square error at a slicer of the first communication device.

7. The apparatus of claim 4, wherein the performance metric comprises a quality measure of an eye diagram associated with a slicer of the first communication device.

8. The apparatus of claim 1, wherein the signal initiating the progression through the set of potential sampling phases has a given frequency offset value.

9. The apparatus of claim 8, wherein the given frequency offset value is fixed.

10. The apparatus of claim 8, wherein the given frequency offset value is variable.

11. The apparatus of claim 10, wherein the given frequency offset value has a variable magnitude proportional to a metric associated with the first communication device.

12. The apparatus of claim 1, wherein the loop filter comprises:
   a first branch; and
   a second branch;
   wherein at least one of a portion of the first branch and a portion of the second branch is disabled, to allow introduction of the signal that initiates the progression through the set of potential sampling phases, until the given sampling phase is determined.

13. An integrated circuit comprising the timing recovery circuitry of claim 1.

14. A method comprising:
   temporarily disabling at least a portion of a timing recovery loop after a temporary power down/power up sequence in a first communication device, the first communication device being in communication with a second communication device prior to the temporary power down/power up sequence in the first communication device; and
   while the portion of the timing recovery loop is temporarily disabled, introducing a signal in a frequency recovery portion of the timing recovery loop operative to initiate a progression through a set of potential sampling phases to determine a given sampling phase at which the first communication device can recommence communication with the second communication device.

15. The method of claim 14, further comprising re-enabling the disabled portion of the timing recovery loop upon determination of the given sampling phase.

16. The method of claim 14, wherein the given sampling phase is determined in accordance with a metric indicative of a proximity to determining the given sampling phase.

17. The method of claim 16, wherein the metric comprises a performance metric.

18. The method of claim 14, wherein the signal initiating the progression through the set of potential sampling phases has a given frequency offset value.

19. The method of claim 14, wherein the temporary power down/power up sequence is in accordance with an Energy-Efficient Ethernet standard.

20. A method of recovering an optimal sampling phase in a receiver after a power down/power up sequence, comprising:
   disabling a sampling phase recovery portion of a timing recovery loop of the receiver;
   introducing a frequency offset in a frequency recovery portion of the timing recovery loop such that the timing recovery loop progresses through a set of potential sampling phases;
   as progression through the set of potential sampling phases proceeds, using a metric to determine how close the timing recovery loop is to the optimal sampling phase; and
   when it is determined that the timing recovery loop is suitably close to the optimal sampling phase, removing the frequency offset and re-enabling the phase recovery portion of the timing recovery loop.

* * * * *